(12) United States Patent
Yoshihara et al.

(10) Patent No.: US 6,869,640 B2
(45) Date of Patent: Mar. 22, 2005

(54) COATING FILM FORMING METHOD AND COATING FILM FORMING APPARATUS (75) Inventors: Kousuke Yoshihara, Kikuchi-gun (JP); Yuichi Terashita, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 10/162,606

(22) Filed: Jun. 6, 2002

(65) Prior Publication Data
US 2003/0008066 A1 Jan. 9, 2003

(30) Foreign Application Priority Data
Jun. 7, 2001 (JP) ........................................ 2001-173137

(51) Int. Cl.[7] .............................. B05D 1/36; B05D 3/12
(52) U.S. Cl. .................... 427/240; 427/299; 427/407.1; 427/422; 427/425; 427/426; 427/427.4; 118/52; 118/315; 118/320; 438/780; 438/782
(58) Field of Search ................................ 427/240, 425, 427/422, 426, 421, 407.1, 427.4, 299; 118/52, 320, 315; 438/780, 782

(56) References Cited

U.S. PATENT DOCUMENTS

| | | | | |
|---|---|---|---|---|
| 5,658,615 A | | 8/1997 | Hasebe et al. ............... | 427/240 |
| 6,059,880 A | * | 5/2000 | Kitano et al. ................. | 118/52 |
| 6,147,010 A | * | 11/2000 | Whitman ..................... | 438/782 |
| 6,376,013 B1 | * | 4/2002 | Rangarajan et al. ......... | 427/240 |
| 6,440,621 B1 | * | 8/2002 | Sutton et al. ................. | 430/30 |
| 6,461,983 B1 | * | 10/2002 | Davlin et al. ............... | 438/782 |

FOREIGN PATENT DOCUMENTS

JP             7-320999            12/1995

* cited by examiner

*Primary Examiner*—Kirsten Jolley
(74) *Attorney, Agent, or Firm*—Oblon, Spivak, McClelland, Maier & Neustadt, P.C.

(57) ABSTRACT

A coating film is formed by the steps of supplying a mixture of a solvent for dissolving a coating liquid and a volatilization suppressing substance for suppressing the volatilization of the solvent onto the surface of the target substrate W, expanding the mixture onto the entire surface of the target substrate W, and supplying a coating liquid onto substantially the central portion of the target substrate W that has received the mixture while rotating the target substrate W thereby expanding the coating liquid outward in the radial direction of the target substrate W thereby forming a coating film.

21 Claims, 9 Drawing Sheets

COATING FILM FORMING METHOD AND COATING FILM FORMING APPARATUS

BACKGROUND OF THE INVENTION

1. Field of the Invention

The present invention relates to a coating film forming method and a coating film forming apparatus for forming a coating film by coating a target substrate such as a semiconductor wafer with coating liquid such as a resist solution.

2. Description of the Related Art

In the manufacturing process of, for example, a semiconductor device, a resist pattern is formed as a mask for forming a prescribed pattern by a so-called photolithography technology in which a resist film is formed by supplying a resist solution onto the surface of a semiconductor wafer (hereinafter referred to simply as "wafer"), followed by applying a light exposure treatment to the wafer after the resist coating in conformity with a prescribed pattern and subsequently developing the exposed pattern formed in the resist film on the wafer. In the resist coating process included in the photolithography technology noted above, a spin coating method is employed in many cases as a method for uniformly coating the wafer surface with the resist solution.

In the spin coating method, a wafer fixed on, for example, a spin chuck by the vacuum suction is rotated together with the spin chuck, and a resist solution is allowed to drip from a resist nozzle arranged above the wafer onto substantially the central portion of the wafer. The resist solution dripping onto the wafer surface is centrifugally expanded outward in the radial direction of the wafer, with the result that a resist film is formed on the entire surface of the wafer. Then, the dripping of the resist solution is stopped, and the wafer is kept rotated so as to remove the excess resist solution on the surface of the wafer W so as to control the thickness of the resist film and to dry the resist film.

It should be noted that, in the conventional spin coating method, a resist solution is allowed to drip onto substantially the central portion of the wafer, and the resist solution is expanded by the centrifugal force generated by the rotation of the wafer, as described above. What should be noted is that the peripheral speed in the outer peripheral portion of the wafer is markedly higher than that in the central portion, with the result that a considerably large amount of the resist solution is scattered from the outer peripheral portion of the wafer. It follows that only about 10 to 20% of the supplied resist solution is actually used for forming the resist film, leading to a markedly large consumption of the resist solution required for forming the resist film. Under the circumstances, it is of high importance nowadays to decrease the amount of the resist consumption for the resist coating step, i.e., to decrease the dripping amount of the resist solution onto the wafer, in view of the saving of the manufacturing cost.

As a method for decreasing the resist solution consumption for forming the resist film, proposed in, for example, JP 7-320999 A is a method (pre-wet system) of allowing a solvent such as a thinner to drip onto the substrate prior to the dripping of the resist solution so as to facilitate the diffusion of the resist solution and, thus, to decrease the supply amount of the resist solution.

However, the effect produced by the prior art quoted above differs depending on the kind of the solvent. In other words, a sufficient effect is not necessarily obtained depending on the solvent used. It is certainly possible to overcome this difficulty by selecting an effective solvent. However, the solvent used by the user is limited and, thus, required is a coating film forming method that permits stably decreasing the amount of the coating liquid used such as a resist solution regardless of the kind of the solvent used.

BRIEF SUMMARY OF THE INVENTION

An object of the present invention is to provide a coating film forming method and a coating film forming apparatus that are based on a pre-wet system and permit stably decreasing the consumption of the coating liquid regardless of the kind of the solvent used.

According to a first aspect of the present invention, there is provided a coating film forming method for forming a coating film by coating the surface of a target substrate to be processed with a coating liquid, comprising the steps of supplying a mixture of a solvent for dissolving said coating liquid and a volatilization suppressing substance for suppressing the volatilization of the solvent onto the surface of said target substrate; expanding said mixture onto the entire surface of said target substrate; and supplying a coating liquid onto substantially the central portion of said target substrate while rotating said target substrate that has supplied said mixture thereby expanding the coating liquid outward in the radial direction of the target substrate thereby forming a coating film.

According to a second aspect of the present invention, there is provided a coating film forming method for forming a coating film by coating the surface of a target substrate with a coating liquid, comprising the steps of supplying a mixture of a solvent dissolving a resist solution and water onto the surface of said target substrate; rotating said target substrate thereby expanding said mixture onto the entire surface of the target substrate; supplying a coating liquid onto substantially the central portion of said target substrate that has supplied said mixture while rotating the target substrate thereby expanding the coating liquid outward in the radial direction of the target substrate, thereby forming a coating film; and centrifugally removing the excess coating liquid after formation of said coating film thereby controlling the thickness of the coating film.

Further, according to a third aspect of the present invention, there is provided a coating film forming apparatus for forming a coating film by supplying a coating liquid onto a rotating target substrate, comprising a substrate holding member for holding a target substrate substantially horizontal; a rotating mechanism for rotating said substrate holding member; a mixture supply mechanism for supplying a mixture of a solvent dissolving a coating liquid and a volatilization suppressing substance for suppressing the volatilization of the solvent onto the target substrate held by said substrate holding member; and a coating liquid supply mechanism for supplying a coating liquid onto substantially the central portion of the target substrate held by said substrate holding member, wherein said mixture is supplied from said mixture supply mechanism onto the target substrate before formation of said coating film, and the target substrate is rotated by said rotating mechanism thereby permitting the mixture to be diffused onto the entire surface of the target substrate.

In the present invention, the pre-wetting is performed by using a mixture of a solvent and a volatilization suppressing substance suppressing the volatilization of the solvent. Therefore, the volatilization of the solvent is suppressed even if the solvent used is highly volatile so as to make it possible to obtain a sufficient pre-wetting effect. It follows that the amount of the coating liquid used can be decreased stably regardless of the kind of the solvent used.

As a result of an extensive research, the present inventors have found that:

(1) In the case of employing the pre-wet system, the resist-saving effect differs depending on the kind of the solvent used because, in the case of using a solvent having a high volatility, the solvent is volatilized before the solvent exhibits a sufficient pre-wetting effect; and (2) The difficulty can be prevented by using a substance capable of suppressing the volatilization of the solvent together with the solvent.

The present invention is based on the two findings pointed out above.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

Some embodiments of the present invention will now be described in detail with reference to the accompanying drawings.

Figure 1:
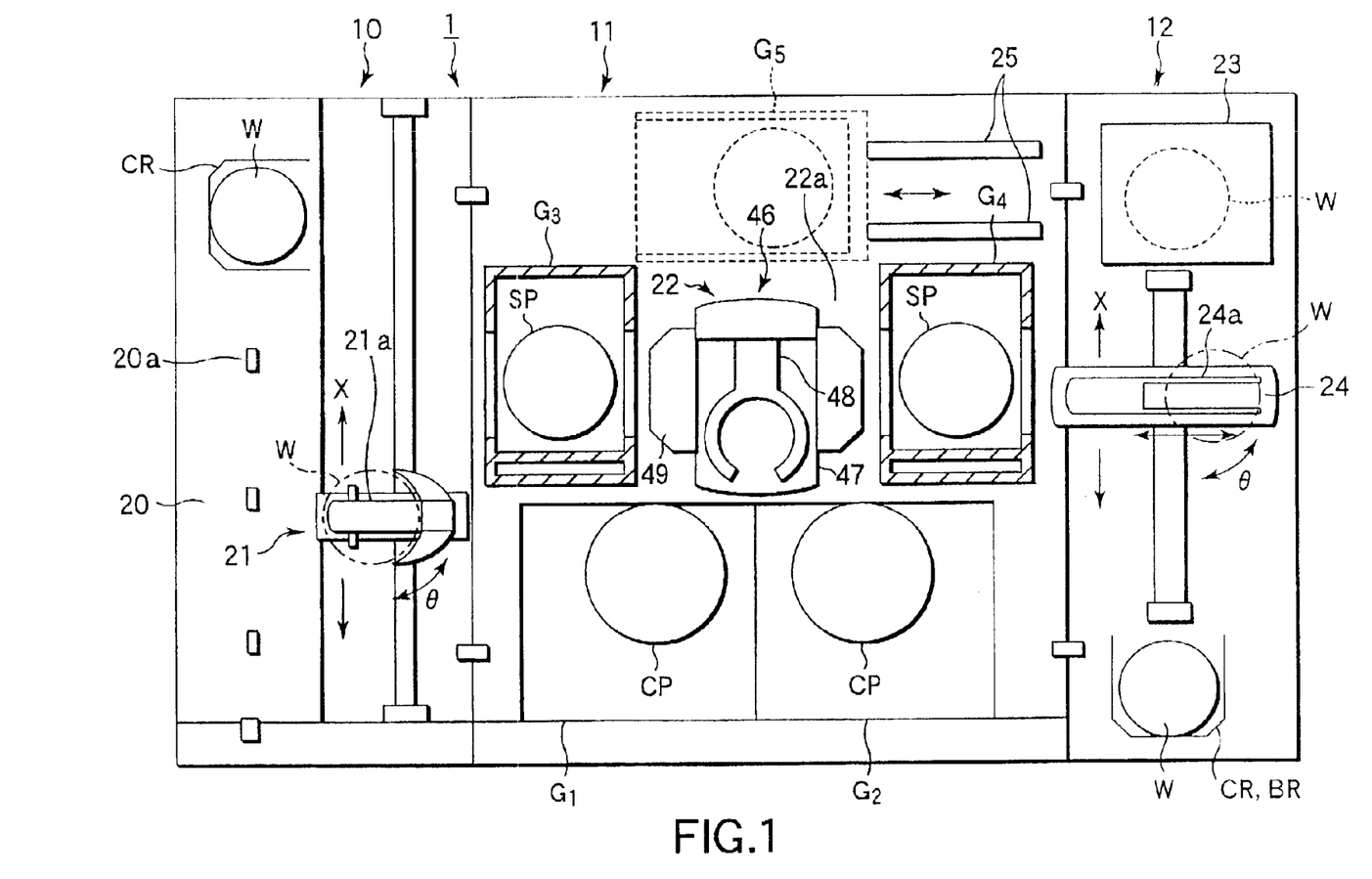
FIG. 1 is a plan view showing the entire construction of a resist coating-developing process system of a semiconductor wafer including a resist coating unit for working the coating film forming method of the present invention.
Figure 2:
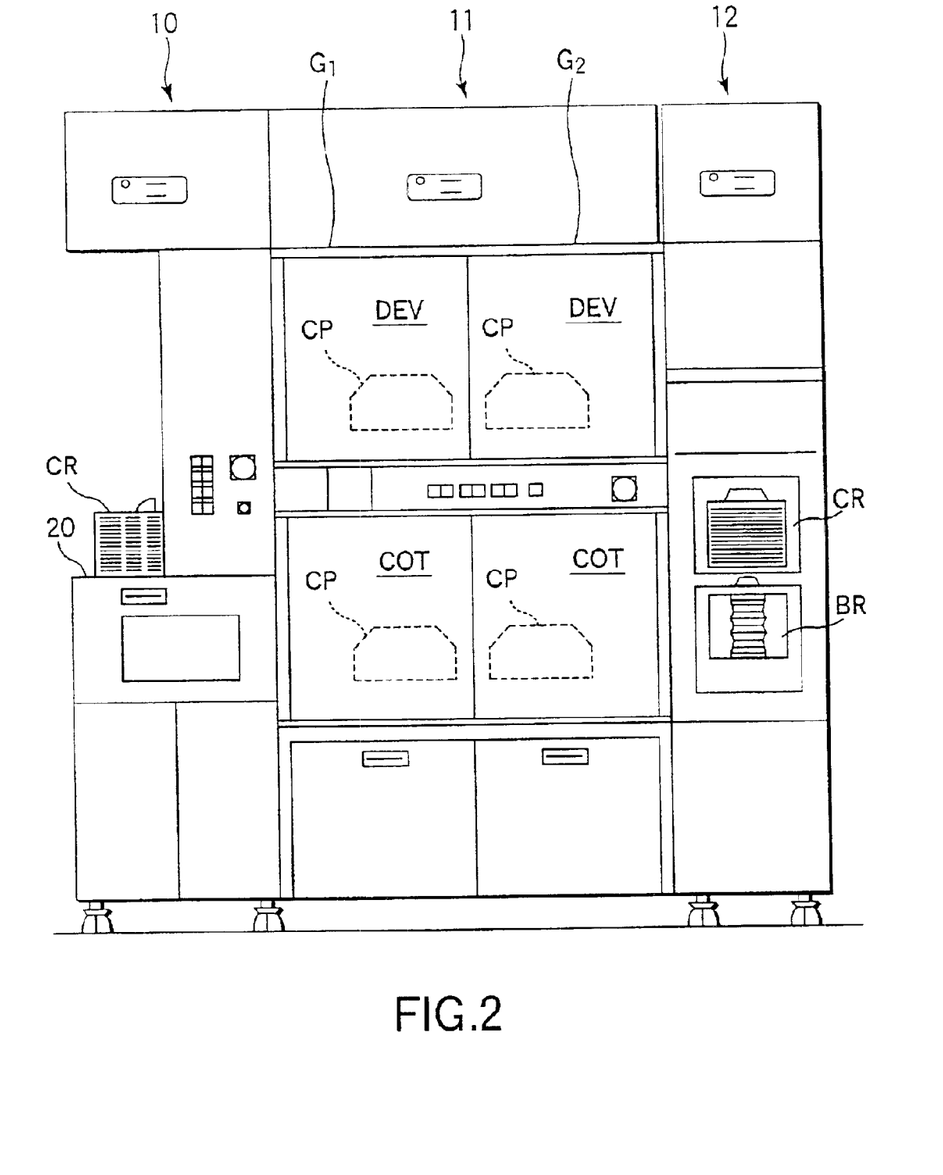
FIG. 2 is a front view of the coating-developing process system shown in FIG. 1.
Figure 3:
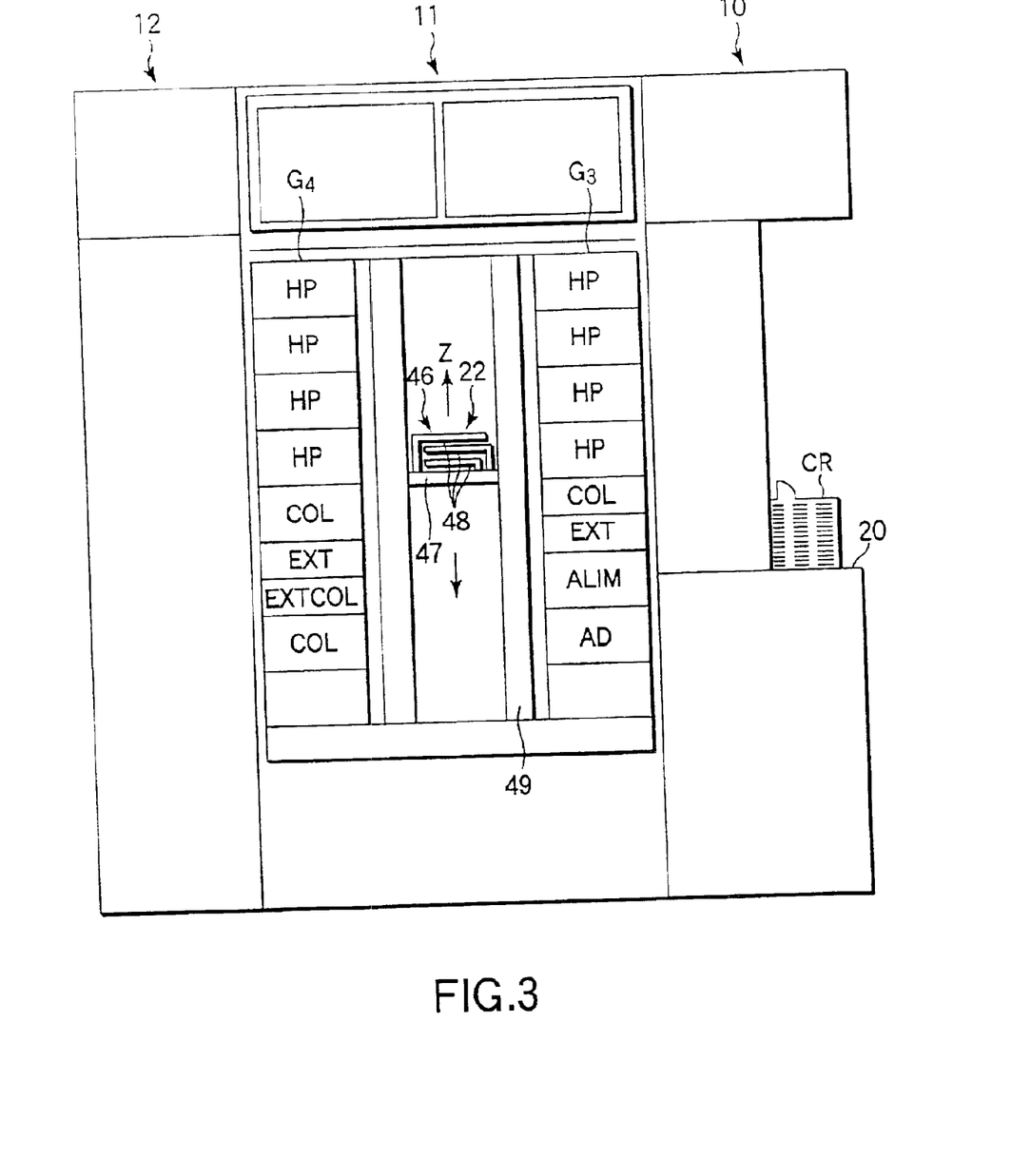
FIG. 3 is a back view of the coating-developing process system shown in FIG. 1.

FIG. 1 is a plan view showing the entire construction of a resist coating-developing process system 1 including a resist coating unit for working the coating film forming method of the present invention, and FIGS. 2 and 3 are a front view and a back view, respectively, of the resist coating-developing process system shown in FIG. 1.

As shown in the drawings, the resist coating-developing process system 1 comprises a cassette station 10, which is a transfer station, a process station 11 including a plurality of process units, and an interface section 12 arranged adjacent to the process station 11 for the delivery of a wafer W between the process station 11 and a light exposure device (not shown).

The cassette station 10 is for transferring a wafer cassette CR housing a plurality of wafers W used as a target object to be processed, e.g., 25 wafers W, from another system to this system, for transferring the particular wafer cassette CR from this system to said another system, or for transferring the wafer W between the wafer cassette CR and the process station 11.

As shown in FIG. 1, in the cassette station 10, a plurality of positioning projections 20a, i.e., four positioning projections 20a in the drawing, are arranged in the X-direction in the drawing on a table 20 on which the cassette CR is disposed. It is possible for the wafer cassettes CR to be disposed on the positions of the projections 20a in a manner to form a row such that the wafer entrances (exits at same time) of the wafer cassettes CR are allowed to face the process station 11. In the wafer cassette CR, the wafers W are arranged in the vertical direction (Z-direction). Further, the cassette station 10 includes a wafer transfer mechanism 21 that is positioned between the table 20 and the process station 11. The wafer transfer mechanism 21 includes a wafer transfer arm 21a movable in the cassette arranging direction (X-direction) and in the arranging direction of the wafers within the wafer cassette CR (Z-direction) such that the transfer arm 21a is capable of selectively gaining access to any of the wafer cassettes CR. Further, the wafer transfer arm 21a is swingable in the θ direction so as to be capable of gaining access to the alignment unit (ALIM) and the extension unit (EXT) referred to herein later, which belong to a third process unit group $G_3$ on the side of the process station 11.

The process station 11 includes a plurality of process units for a series of processes for coating and developing the resist to the wafer W. These process units are arranged in prescribed positions to form a multi-stage structure, and the wafers W are processed one by one in these process units. As shown in FIG. 1, a transfer path 22a is formed in the central portion of the process station 11. A main wafer transfer mechanism 22 is arranged in the transfer path 22a and all the process units are arranged around the transfer path 22a. These plural process units are divided into a plurality of process unit groups each consisting of a plurality of process units arranged in the vertical direction to form a multi-stage structure.

As shown in FIG. 3, the main wafer transfer mechanism 22 comprises a cylindrical support body 49 and a wafer transfer device 46 arranged movable in the vertical direction (Z-direction) inside the cylindrical support body 49. The cylindrical support body 49 can be rotated by a not shown motor, and the wafer transfer device 46 can also be rotated integrally in accordance with the rotation of the cylindrical support body 49.

The wafer transfer device 46 includes a plurality of holding members 48 movable back and forth along a transfer base 47 so as to achieve the wafer delivery among the process units.

In this embodiment, first to fourth process unit groups $G_1$, $G_2$, $G_3$ and $G_4$ are arranged around the transfer path 22a, as shown in FIG. 1. Further, a fifth process unit group $G_5$ can be arranged, as required.

The first and second process unit groups $G_1$ and $G_2$ are arranged in a line on the front side of the system (lower side in FIG. 1). The third process unit group $G_3$ is arranged adjacent to the cassette station 10, and the fourth process unit group $G_4$ is arranged adjacent to the interface section 12. Further, the fifth process unit group $G_5$ can be arranged in the back portion.

Arranged in the first process unit group $G_1$ is a resist coating process unit (COT) for coating a resist on the wafer W disposed on a not shown spin chuck within a cup CP. Further, stacked on the resist coating process unit (COT) is a developing process unit (DEV) for developing a pattern of the resist within the cup CP. Likewise, arranged in the second process unit group $G_2$ is a resist coating process unit (COT) as two spinner type process units, and a developing process unit (DEV) is stacked on the resist coating process unit (COT).

In the third process unit group $G_3$, a plurality of oven type process units for applying a prescribed process to the wafer W disposed on a table SP are stacked one upon the other, as shown in FIG. 3. To be more specific, the third process unit group $G_3$ includes an adhesion unit (AD) for applying a so-called "hydrophobic processing" for improving the fixing properties of the resist, an alignment unit (ALIM) for aligning the position of the wafer W, an extension unit (EXT) for transferring the wafer W, a cooling unit (COL) for a cooling processing, and four hot plate units (HP) for a heat processing before or after the light exposure process and after the developing processing. These process units are stacked one upon the other in the order mentioned to form an eight-stage structure. Incidentally, the alignment unit (ALIM) may be replaced by the cooling unit (COL) which works also as an alignment unit.

The fourth process unit group $G_4$ also includes a plurality of oven type process units stacked one upon the other. To be more specific, the fourth process unit group $G_4$ includes a cooling unit (COL), an extension-cooling unit (EXTCOL) constituting a wafer delivery section equipped with a cooling plate, another cooling unit (COL), and four hot plate units (HP), which are stacked one upon the other in the order mentioned so as to form an eight-stage structure.

Where the fifth process unit group $G_5$ is installed at the back side of the main wafer transfer mechanism 22, the fifth process unit group $G_5$ is movable sideward along a guide rail 25 as viewed from the main wafer transfer mechanism 22. It follows that, even where the fifth process unit group $G_5$ is installed, the fifth process unit group $G_5$ can be slid along the guide rail 25 so as to ensure a free space behind the main wafer transfer mechanism 22. As a result, a maintenance operation for the main wafer transfer mechanism 22 can be executed easily from behind the main wafer transfer mechanism 22.

The interface section 12 is equal to the process station 11 in the length in the X-direction. As shown in FIGS. 1 and 2, a flexible pick-up cassette CR and a stationary buffer cassette BR are stacked one upon the other in a front portion of the interface section 12. A peripheral light exposure device 23 is arranged in a back portion of the interface section 12. Further, a wafer transfer mechanism 24 is arranged in the central portion of the interface section 12. The wafer transfer mechanism 24 includes a wafer transfer arm 24a, which is movable both in the X-direction and the Z-direction so as to gain access to the cassettes CR, BR and the peripheral light exposure device 23. Also, the wafer transfer arm 24a is swingable in the θ direction so as to gain access to the extension unit (EXT) in the fourth process unit group $G_4$ of the process station 11 and to a not shown wafer delivery table adjacent to the light exposure device.

In the resist coating-developing process system 1 of the construction described above, unprocessed wafers W are taken out one by one from the wafer cassette CR so as to be transferred into the alignment unit (ALIM) of the process station 11. Then, the wafer W whose position has been aligned is taken out by the main wafer transfer mechanism 22 so as to be transferred into the adhesion unit (AD) for the adhesion processing. After completion of the adhesion processing, the wafer W is taken out by the main wafer transfer mechanism 22 so as to be transferred into the cooling unit (COL) for the cooling processing. Further, the wafer W is transferred into the resist coating unit (COT) for the resist coating processing and, then, into the hot plate unit (HP) for the pre-bake treatment. Still further, the wafer W is transferred into the interface section 12 through the extension-cooling unit (EXTCOL) and, then, the wafer W is further transferred by the wafer transfer mechanism 24 into the adjacent light exposure device. The exposed wafer W is transferred by the wafer transfer mechanism 24 into the process station 11 through the interface section 12 and the extension unit (EXT). In the process station 11, the wafer W is transferred by the main wafer transfer mechanism 22 into the hot plate unit (HP) for the post exposure processing and, then, transferred into the developing unit (DEV) for the developing processing. After the developing, the wafer W is post-baked in the hot plate unit (HP) and, then, cooled in the cooling unit (COL), followed by transferring the wafer W into the cassette station 10 through the extension unit (EXT). After completing a series of these processings, the wafer W is transferred by the wafer transfer mechanism 22 into the wafer cassette CR so as to be housed in the wafer cassette CR.

Figure 4:
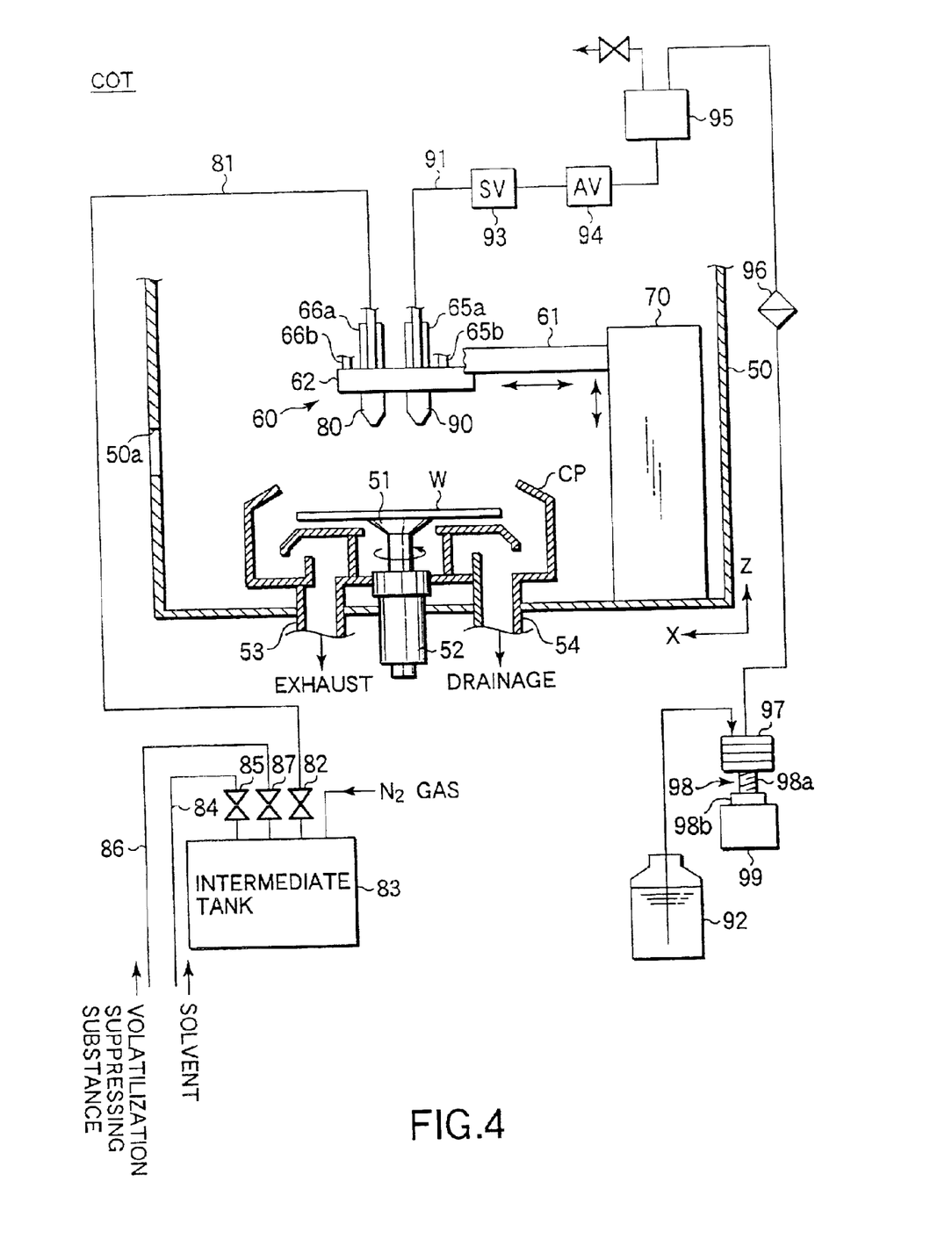
FIG. 4 is a cross sectional view showing the entire construction of the resist coating unit mounted to the resist coating-developing process system shown in FIGS. 1 to 3.

The resist coating unit (COT) for working the coating film forming method of the present invention will now be described with reference to FIGS. 4 and 5.

The resist coating unit (COT) includes a casing 50 provided with an opening 50a through which the holding member 48 of the main wafer transfer mechanism 22 is inserted into the casing 50. A cup CP, which is a container for housing the wafer W, is arranged within the casing 50, and a spin chuck 51 for holding the wafer W horizontal by vacuum suction is arranged inside the cup CP. The spin chuck 51 can be rotated by a driving motor 52 such as a pulse motor arranged below the cup CP, and the rotating speed of the spin chuck 51 can be controlled optionally. An exhaust pipe 53 is connected to that portion of the bottom of the cup CP which is positioned close to the central portion of the bottom of the cup CP, and a drain pipe 54 is connected to that portion of the bottom of the cup CP which is positioned close to the outer portion of the bottom of the cup CP. The gaseous material within the cup CP is discharged to the outside through the exhaust pipe 53, and the resist solution and the solvent scattered during the coating processing are discharged to the outside through the drain pipe 54. Incidentally, the spin chuck 51 can be vertically moved by a not shown lift mechanism such as an air cylinder.

A spurting head 60 movable between the position right above the spin chuck 51 and a retreat position is arranged above the spin chuck 51. The spurting head 60 is connected to a driving mechanism 70 with an arm 61 interposed therebetween. The spurting head 60 can be moved in the X-direction by the driving mechanism 70, the Y-direction and the Z-direction shown in FIGS. 4 and 5. Incidentally, the spurting head 60 is detachable from the arm 61.

The spurting head 60 includes a base member 62, a mixture supply nozzle 80 for supplying a mixture of a solvent capable of dissolving a coating liquid and a volatilization suppressing substance suppressing the volatilization of the solvent, and a resist solution supply nozzle 90 positioned close to the mixture supply nozzle 80 for supplying a resist solution, which is a coating liquid. As shown in the drawing, the spurting head 60 is constructed such that the mixture supply nozzle 80 and the resist solution supply nozzle 90 are mounted to the base member 61. It should be noted that it is possible for the solvent capable of dissolving the coating liquid to be a solvent of the coating liquid. In addition, it is possible to use any solvent as far as the solvent is capable of dissolving the coating liquid.

The sputring head 60 is provided with tubes 65a, 65b for circulating a temperature adjusting fluid for the temperature adjustment such that the temperature of the resist solution spurted from the resist solution supply nozzle 90 is rendered constant and with tubes 66a, 66b for circulating a temperature adjusting fluid for the temperature adjustment such that the temperature of the solvent spurted from the mixture supply nozzle 80 is rendered constant. The tube 65a is arranged around a pipe contiguous to the resist solution supply nozzle 90 so as to constitute a forward passageway, and the tube 65b constitutes a return passageway. Also, the tube 66a is arranged around a pipe contiguous to the mixture supply nozzle 80 so as to constitute a forward passageway, and the tube 66b constitutes a return passageway.

The mixture supply nozzle 80 is connected to an intermediate tank 83 via a mixture supply pipe 81, and a valve 82 is mounted to the mixture supply pipe 81. A solvent supply pipe 84 for supplying a solvent into the intermediate tank 83 and a volatilization suppressing substance supply pipe 86 for supplying a volatilization suppressing substance into the intermediate tank 83 are connected to the intermediate tank 83. Valves 85 and 87 are mounted to these pipes 84 and 86, respectively. The solvent and the volatilization suppressing substance supplied into the intermediate tank 83 through the pipes 84 and 86, respectively, are stirred by a not shown stirring mechanism so as to form a mixture, and the mixture thus formed is stored in the intermediate tank 83. A compressed gas such as a compressed nitrogen gas ($N_2$) is supplied into the intermediate tank 83 so as to permit the mixture to be supplied onto the wafer W through the mixture supply pipe 81 and the mixture supply nozzle 80. In this case, the flow rate of the mixture is controlled by controlling the pressurizing force of the $N_2$ gas.

The resist solution supply nozzle 90 communicates via a resist solution supply pipe 91 with a resist solution tank 92 housing a resist solution. Mounted to the resist solution supply pipe 91 are a suck back valve 93, an air operation valve 94, a bubble removing mechanism 95 for separating and removing the bubbles within the resist solution, a filter 96 and a bellows pump 97 in the order mentioned as viewed from the downstream side. The bellows pump 97 is shrinkable. By controlling the shrinkage of the bellows pump 97, a prescribed amount of the resist solution is supplied onto the surface of the wafer W through the resist solution supply nozzle 90. The bellows pump 97 makes it possible to control a very small supply amount of the resist solution. The driving section of the bellows pump 97 comprises a ball screw mechanism 98 including a screw 98a having one end mounted to one end of the bellows pump 97 and a nut 98b engaged with the screw 98a, and a stepping motor 99 that rotates the nut 98b so as to permit the screw 98a to make a linear motion.

The suck back valve 93 mounted to the resist solution supply system noted above serves to bring the resist solution remaining by surface tension on the inner wall in the tip portion of the resist solution supply nozzle 90 after sputring of the resist solution from the resist solution supply nozzle 90 back into the resist solution supply nozzle 90. As a result, the residual resist solution is prevented from being solidified.

Figure 5:
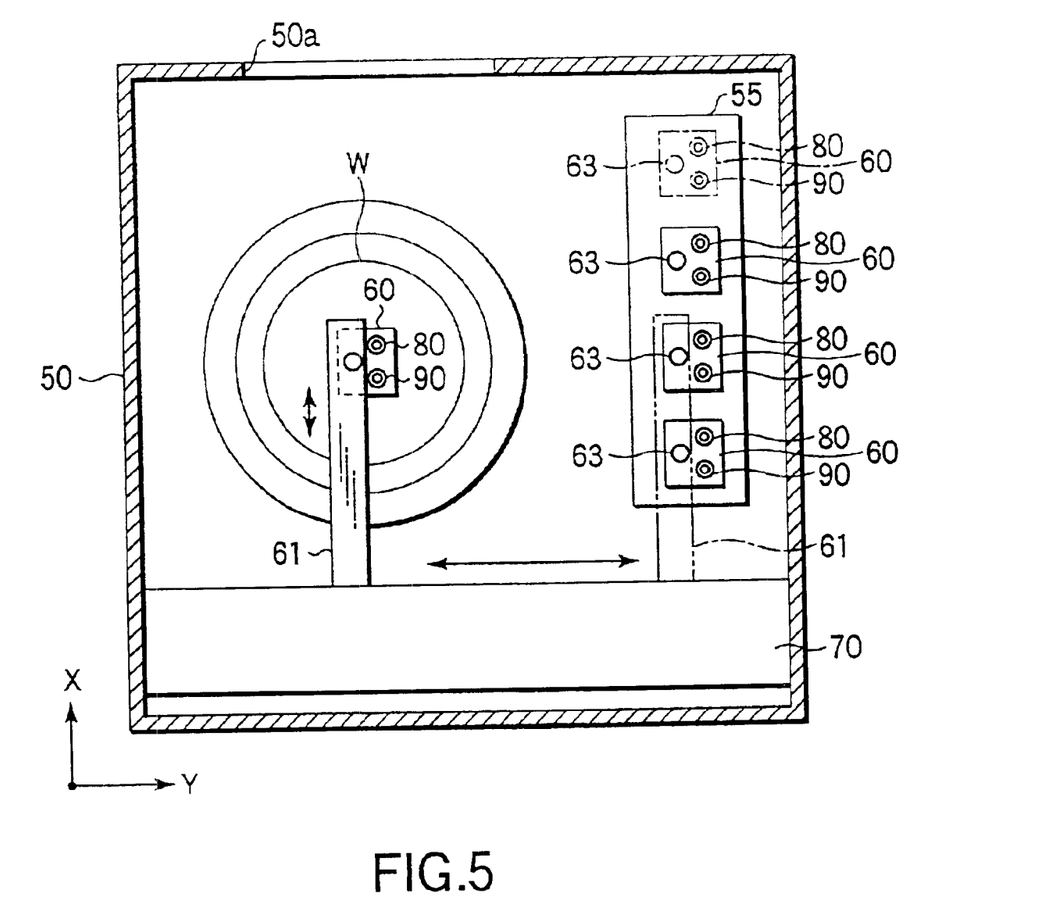
FIG. 5 is a plan view of the resist coating unit shown in FIG. 4.

As shown in FIG. 5, a holding section 55 capable of holding four spurting heads 60, which are basically equal to each other in construction, is arranged in the outside portion of the cup CP within the casing 50. In order to prevent the nozzle port of each nozzle from being dried and solidified, an not shown inserting section for placing the nozzle port of each nozzle under a solvent atmosphere is mounted to the holding section 55. Each spurting head 60 can be mounted to the tip portion of the arm 61 by a mounting section 63 so as to permit the four spurting heads 60 to supply different kinds of resist solutions onto the surfaces of the wafers W. A selected one of the spurting heads 60 is mounted to the arm 61 so as to be taken out of the holding section 55. As described previously, the arm 61 can be moved by the driving mechanism 70 in three dimensional directions, i.e., in the X-, Y- and Z directions, such that the spurting head 60 taken out of the holding section 55 and mounted to the arm 61 is moved to a prescribed position right above the wafer W in a coating processing. Incidentally, in this embodiment, the mixture supply nozzle 80 and the resist solution supply nozzle 90 are mounted to the spurting head 60, and four spurting heads 60 of the particular construction are arranged in the holding section 55. Alternatively, it is possible to fix a single or a plurality of mixture supply nozzles 80 directly to the arm 61 and to mount the resist solution supply nozzle 90 alone to the sputring head 60.

Figure 6:
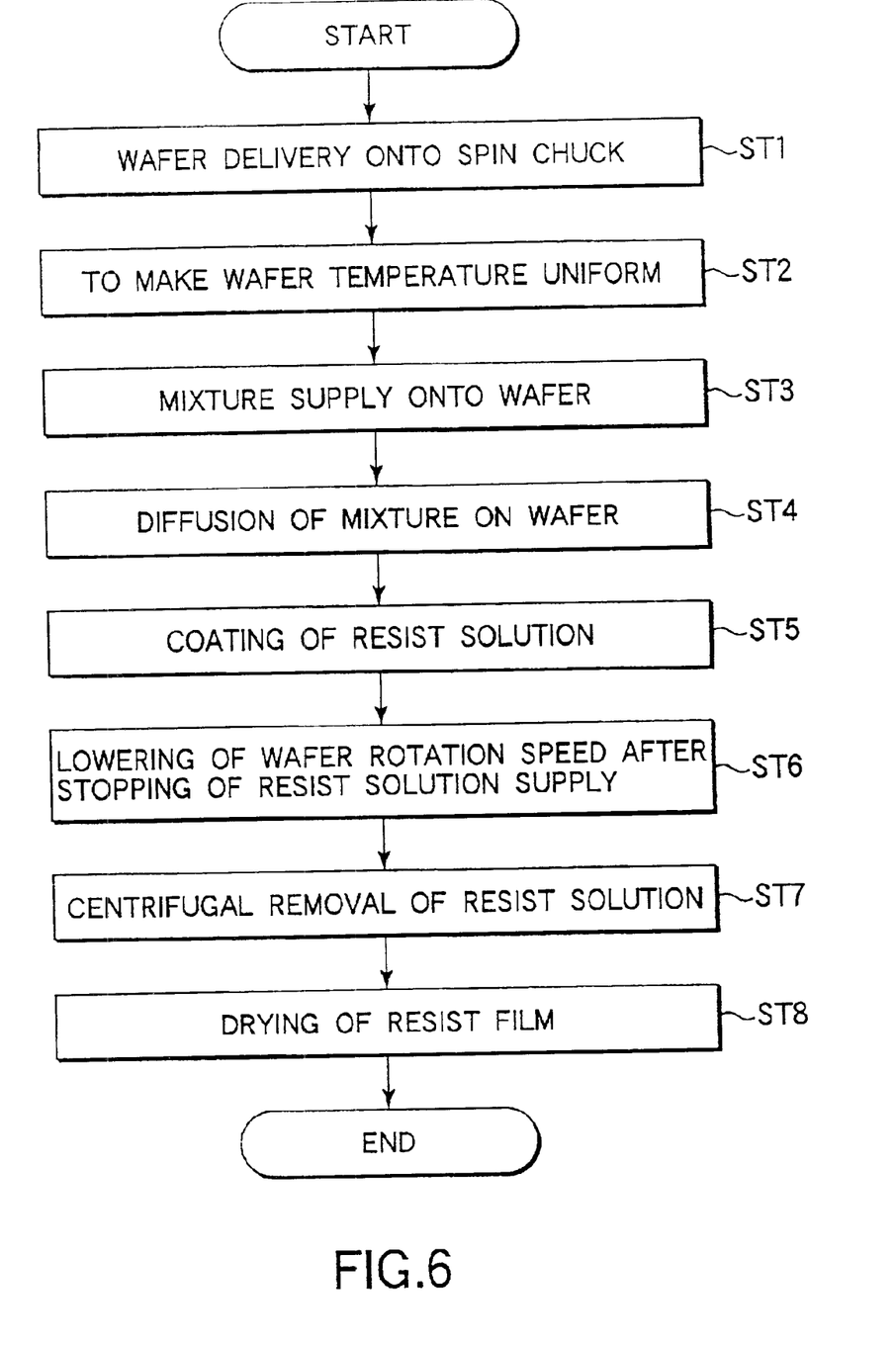
FIG. 6 is a flow chart showing the process steps in the resist coating unit.

The processing carried out in the resist coating unit (COT) of the particular construction described above will now be described in detail with reference to the flow chart shown in FIG. 6.

If the wafer W is transferred through the opening 50a of the casing 50 by the holding member 48 of the main wafer transfer mechanism 22 onto a position right above the cup CP within the resist coating unit (COT), the wafer W is held by vacuum suction by the spin chuck 51 moved upward by the not shown lift mechanism. After the wafer W is held by the spin chuck 51 by vacuum suction, the main wafer transfer mechanism 22 brings back the holding member 48 from within the resist coating unit (COT) so as to finish delivery of the wafer W into the resist coating unit (COT) (step ST 1).

Then, the spin chuck 51 is moved downward until the wafer W reaches a prescribed position within the cup CP, followed by allowing the driving motor 52 to rotate the spin chuck 51 at a rotating speed of about 1,000 rpm so as to make the temperature of the wafer W uniform (step ST 2).

In the next step, the rotation of the spin chuck 51 is stopped, and the sputring head 60 is moved by the driving mechanism 70 in the Y-direction so as to reach a position right above the wafer W. When sputring port of the mixture supply nozzle 80 included in the sputring head 60 has been moved to reach a position right above the center of the spin chuck 51, i.e., above the center of the wafer W, the mixture of a prescribed solvent capable of dissolving the resist and a volatilization suppressing substance suppressing the volatilization of the solvent is supplied onto substantially the center on the surface of the stationary wafer W (step ST 3). In this step, the solvent and the volatilization suppressing substance are supplied at a prescribed mixing ratio into the intermediate tank 83 through the solvent supply pipe 84 and the volatilization suppressing substance supply pipe 86, respectively. Further, the solvent and the volatilization suppressing substance are stirred by a not shown stirring mechanism within the intermediate tank 83, with the valves 85 and 87 closed, so as to form a prescribed amount of the mixture. Further, the mixture formed and stored within the intermediate tank 83 is pressurized by a pressurizing gas such as a $N_2$ gas so as to be supplied onto the wafer W through the mixture supply pipe 81 and the mixture supply nozzle 80. In this case, the flow rate of the mixture is controlled by controlling the pressurizing force of the $N_2$ gas.

After the mixture has been supplied onto the wafer W, the wafer W is rotated at a prescribed rotating speed, preferably at a rotating speed not higher than 1,000 rpm (step ST 4). As a result, the mixture supplied onto the surface of the wafer W is centrifugally diffused from the central portion toward the peripheral portion of the wafer W such that the mixture is uniformly spread over the entire surface of the wafer W. Incidentally, the mixture can be supplied onto the wafer W while rotating the wafer W. In other words, it is possible to carry out simultaneously the steps ST 3 and ST 4 described above. It is also possible to employ a spraying method for coating the entire surface of the wafer W with the mixture. In this case, the wafer W can be rotated or stopped during the spraying operation.

In the next step, the spurting head 60 is moved in the Y-direction by the driving mechanism 70 until the spurting port of the resist solution supply nozzle 90 is moved to reach a position right above the center of the spin chuck 51, i.e., right above the center of the wafer W, and the rotating speed of the wafer W is increased to a prescribed level. Under this state, the resist solution is supplied from the spurting port of the resist solution supply nozzle 90 onto substantially the center on the surface of the rotating wafer W so as to permit the resist solution to be centrifugally diffused outward, thereby coating the surface of the wafer W with the resist solution (step ST 5). Where the wafer has a diameter of 200 mm, it is desirable to set the rotating speed of the wafer W at 2,000 to 6,000 rpm. Also, where the wafer has a diameter of 300 mm, it is desirable to set the rotating speed of the wafer W at 1,000 to 4,000 rpm.

After the resist solution has been supplied while rotating the wafer W, the supply of the resist solution is stopped, and the rotating speed of the wafer W is lowered (step ST 6). As a result, the function of adjusting the thickness of the resist solution film is produced so as to make the thickness of the resist solution film uniform over the entire region of the wafer W. The particular effect can be produced because, when the rotating speed of the wafer W is lowered, the force toward the center is exerted on the resist solution on the semiconductor wafer W by the deceleration. In addition, the resist solution is dried slowly because the target substrate is rotated at a low speed. It follows that the function of controlling the thickness of the resist film is produced. What should be noted is that the scattering of the resist from the wafer W is suppressed by the inward force produced by the deceleration so as to permit the resist to be retained in the outer peripheral portion as in the central portion of the wafer W, thereby making uniform the thickness of the resist film formed on the wafer W. In this case, it is desirable for the rotating speed of the wafer W to be 50 to 1,000 rpm. Particularly, if the rotating speed of the wafer W is not higher than 500 rpm, the drying of the resist scarcely proceeds, leading to a high degree of freedom in the thickness control. The holding time in this step is set appropriately so as not to exceed, for example, 3 seconds. Incidentally, the process in step ST 6 is not absolutely necessary and is carried out as required.

Then, the rotating speed of the wafer W is increased so as to centrifugally remove the residual resist solution (step ST 7). It is desirable for the rotating speed of the wafer W in this step to be 1,500 to 4,000 rpm in the case where the wafer W has a diameter of 200 mm and to be 1,000 to 3,000 rpm in the case where the wafer W has a diameter of 300 rpm.

After removal of the residual resist solution in step ST 7, the rotation of the wafer W is continued so as to dry the resist film (step ST 8). It is desirable for the rotating speed of the wafer W in this step to be 1,000 to 2,000 rpm in the case where the wafer W has a diameter of 200 mm and to be 500 to 1,500 rpm in the case where the wafer W has a diameter of 300 rpm. The resist coating step is finished after the drying step is performed for a prescribed period of time in step ST 8.

As described above, in the present invention, the entire surface of the wafer W is coated with a mixture of a solvent capable of dissolving the resist and a volatilization suppressing substance suppressing the volatilization of the solvent prior to the coating of the resist solution. Therefore, even if the solvent used is highly volatile, the volatilization of the solvent is suppressed by the volatilization suppressing substance so as to produce the effect of sufficiently diffusing the resist solution in the subsequent coating step of the resist solution. It follows that the amount of the resist solution used can be stably decreased regardless of the kind of the solvent used.

The solvent contained in the mixture should be capable of dissolving the resist. Typically, a thinner is contained as the solvent in the mixture. To be more specific, it is possible for the mixture to contain at least one kind of the solvent selected from the group consisting of, for example, propylene glycol monomethyl ether, propylene glycol monomethyl ether acetate, butyl acetate, ethyl lactate, ethyl cellosolve acetate, and methyl methoxy propionate. Particularly, the effect of the present invention is improved in the case of using at least one kind of the solvent selected from the group consisting of propylene glycol monomethyl ether and propylene glycol monomethyl ether acetate as the solvent. Of course, it is also possible to use another solvent as far as the solvent is capable of dissolving the resist.

It is desirable for the volatilization suppressing substance used in the present invention to have a hydrogen bond. At least one kind of the substance selected from the group consisting of water, methyl alcohol, ethyl alcohol and isopropyl alcohol (IPA) is suitably used as the substance having a hydrogen bond. Among these substances, it is desirable to use water, particularly pure water, as the volatilization suppressing substance. Of course, it is also possible to use another substance as far as the substance is capable of effectively suppressing the volatilization of the solvent used.

It is desirable for the amount of the volatilization suppressing substance to be not smaller than 5% by mass and smaller than 50% by mass of the entire mixture. If the amount of the volatilization suppressing substance is smaller than 5% by mass, the volatilization suppressing effect tends to be rendered insufficient. On the other hand, if the amount of the volatilization suppressing substance is not smaller than 50% by mass, the resist solution diffusing effect produced by the solvent tends to be rendered insufficient. The supply amount of the mixture is, for example, 2 ml in the case where the wafer W has a diameter of 200 mm, and 3 ml in the case where the wafer W has a diameter of 300 mm.

The temperature control of the mixture is carried out at a suitable temperature falling within a range of between, for example, 18° C. and 24° C. Within this temperature range, the mixture is allowed to wet the wafer surface uniformly so as to make it possible to render uniform the thickness of the resist film. It should be noted that it is necessary to eliminate the temperature difference between the central portion and the outer peripheral portion of the wafer W as much as possible. Because of the particular requirement, the appropriate temperature is changed depending on the size of the wafer. For example, the appropriate temperature is 22 to 24° C. in the case of the wafer W having a diameter of 200 mm. However, where the diameter of the wafer W is increased to 300 mm, the peripheral speed in the outer peripheral portion of the wafer W is increased. As a result, the temperature difference tends to be generated between the central portion and the outer peripheral portion of the wafer W and, thus, the solvent contained in the mixture tends to be volatilized in the outer peripheral portion of the wafer W. Such being the situation, the temperature of the mixture is set a somewhat low level of 18 to 19° C. in order to eliminate the temperature difference between the central portion and the outer peripheral portion of the wafer W as much as possible.

Some experiments for actually confirming the effect of the present invention will now be described.

In the first experiment, the minimum amount of the resist that can be coated on the entire wafer surface was measured by using a wafer having a diameter of 200 mm. The experiment covered the case where butyl acetate, propylene glycol monomethyl ether (PGME), or ethyl lactate was used as a solvent for the pre-wetting and the case where the pre-wetting was not performed. A solution having a viscosity of about 7 CP, which was prepared by dissolving a KrF resist in an EL solvent, was used as the resist solution. The wafer was rotated at a speed of 3,000 to 6,000 rpm during dripping of the resist solution, and the supply amount of the solvent was 2 ml. It has been found that the minimum amount of the resist solution that can be coated on the entire wafer surface can be markedly decreased by applying the pre-wetting, as shown in Table 1, though the degree of reduction in the amount of the required resist solution differs depending on the kind of the solvent used. It is considered reasonable to understand that the difference in the degree of reduction noted above is caused by the difference in the volatilizing rate of the solvent. To be more specific, it is considered reasonable to understand that, if the solvent has a low volatilizing rate, a greater amount of the solvent remains on the wafer surface during dripping of the resist solution so as to improve the resist diffusion effect.

TABLE 1

| Minimum amount of resist solution on 200 mm wafer | |
| --- | --- |
| no pre-wetting | 0.85 ml |
| butyl acetate | 0.6 ml |
| PGME | 0.45 ml |
| ethyl lactate | 0.25 ml |

Then, a second resist coating experiment was conducted similarly by using a wafer having a diameter of 300 mm. In the second experiment, the pre-wetting was performed by using the three kinds of the solvents equal to those used in the first experiment. The rotating speed of the wafer was set at 2,000 to 4,000 rpm during dripping of the resist solution, and the supply amount of the solvent was 3 ml. It has been found that the difference in the minimum amount of the resist solution required for the coating on the entire surface of the wafer depending on the kind of the solvent used is rendered greater than that in the case of using the wafer having a diameter of 200 mm, as shown in Table 2. Table 2 also shows that PGME constituting the main component of the PGME series thinner, which is most frequently used nowadays, is incapable of producing a sufficient resist saving effect.

TABLE 2

| Minimum amount of resist solution on 300 mm wafer | |
| --- | --- |
| butyl acetate | 2.0 ml or more |
| PGME | 1.7 ml |
| ethyl lactate | 0.65 ml |

Further, a third experiment was conducted for measuring the minimum amount of the resist solution that can be coated on the entire surface of each of the wafer having a diameter of 200 mm and the wafer having a diameter of 300 mm, covering the cases where the pre-wetting was performed by using PGME and where the pre-wetting was performed by using a mixture specified in the present invention, i.e., a mixture of PGME and a pure water used as the volatilization suppressing substance. The mixing ratio of PGME to the pure water in the mixture was set at 5:1 (16.7% by mass of the pure water). The resist solution and the coating conditions were equal to those in the first and second experiments given above. As a result, it has been confirmed that, in the case of performing the pre-wetting by using a mixture of PGME and a pure water, the minimum amount of the resist solution required for the coating on the entire wafer surface is rendered smaller than half the amount in the case where the pre-wetting is performed by using PGME alone in any of the wafer having a diameter of 200 mm and the wafer having a diameter of 300 mm. It is considered reasonable to understand that, by the addition of a pure water, a hydrogen bond is formed between the solvent molecule and the water molecule so as to suppress the volatilization of the solvent, with the result that the amount of the solvent remaining on the wafer surface is increased in the resist dripping step. A similar result was exhibited in the case of using a mixture prepared by adding a pure water to a general purpose thinner of OK 73 (PGME:PGMEA (propylene glycol monomethyl ether acetate)=7:3) in the same mixing ratio. In conclusion, it has been confirmed that a prominent resist saving effect can be produced in the case of performing the pre-wetting by using a mixture specified in the present invention of a solvent and a pure water.

TABLE 3

| Minimum amount of resist solution on 200 mm wafer | PGME | 0.45 ml |
| --- | --- | --- |
| | PGME + pure water | 0.2 ml |
| Minimum amount of resist solution on 300 mm wafer | PGME | 1.7 ml |
| | PGME + pure water | 0.7 ml or less |

Figure 7:
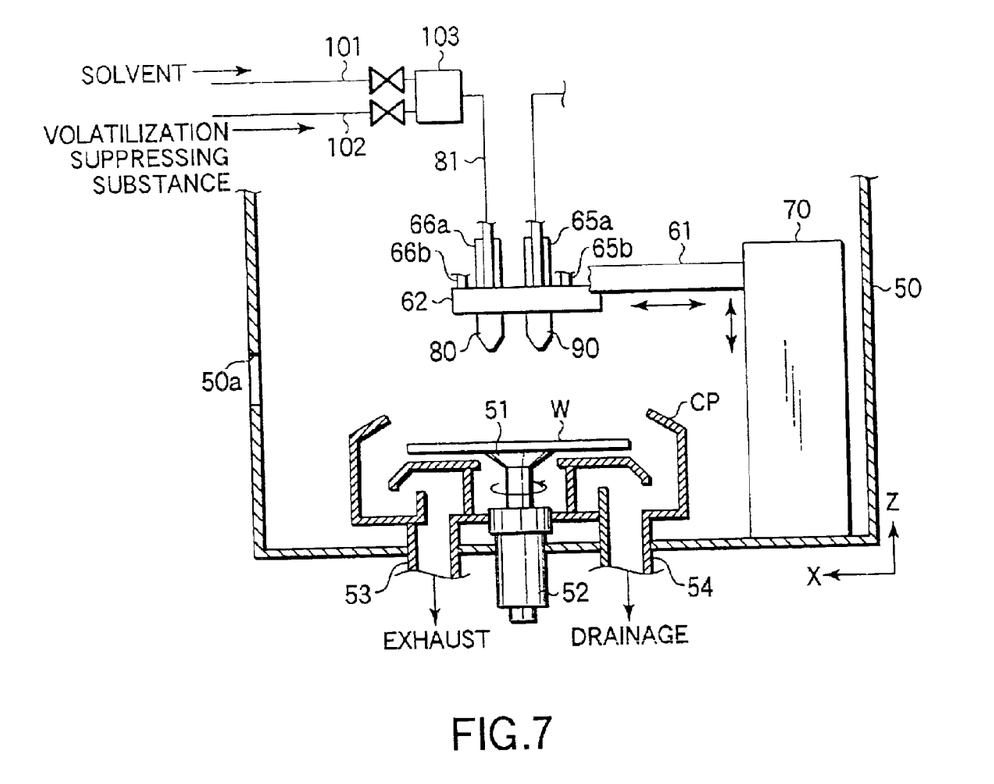
FIG. 7 is a cross sectional view showing another example of a mixture supply means used in the resist coating unit.

Other examples of the supply means of the mixture of a solvent and a volatilization suppressing substance will now be described. In the embodiment described above, a mixture is formed in the intermediate tank 83, and the mixture formed is supplied from the intermediate tank 83 by utilizing a pressurizing gas. Alternatively, it is also possible to use a system shown in FIG. 7. In the system shown in FIG. 7, a solvent supplied through a solvent supply pipe 101 extending from a not shown intermediate tank and a volatilization suppressing substance supplied at a prescribed flow rate through a volatilization suppressing substance supply pipe 102 extending from a not shown intermediate tank are mixed in a static mixer 103 arranged in the vicinity of the mixture supply nozzle 80, and the mixture is supplied from the static mixer 103 into the mixture supply nozzle 80 through the mixture supply pipe 81.

Figure 8:
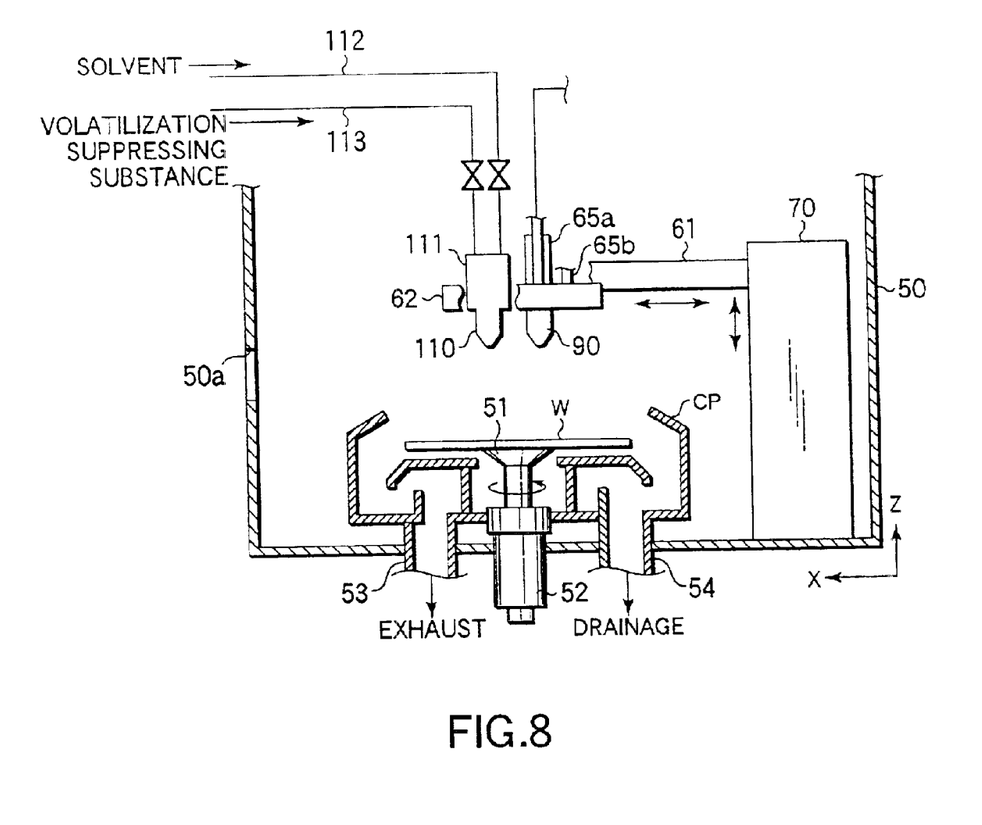
FIG. 8 is a cross sectional view showing another example of a mixture supply means used in the resist coating unit.

FIG. 8 shows another example of the mixture supply means. As shown in the drawing, arranged is a mixture supply nozzle 110 provided with a mixing section 111. In this case, a solvent supply pipe 112 extending from a not shown intermediate tank and a volatilization suppressing substance pipe 113 extending from a not shown intermediate tank are connected to the mixing section 111 so as to permit the solvent and the volatilization suppressing substance supplied through the pipes 112 and 113, respectively, are mixed in the mixing section 111.

Figure 9:
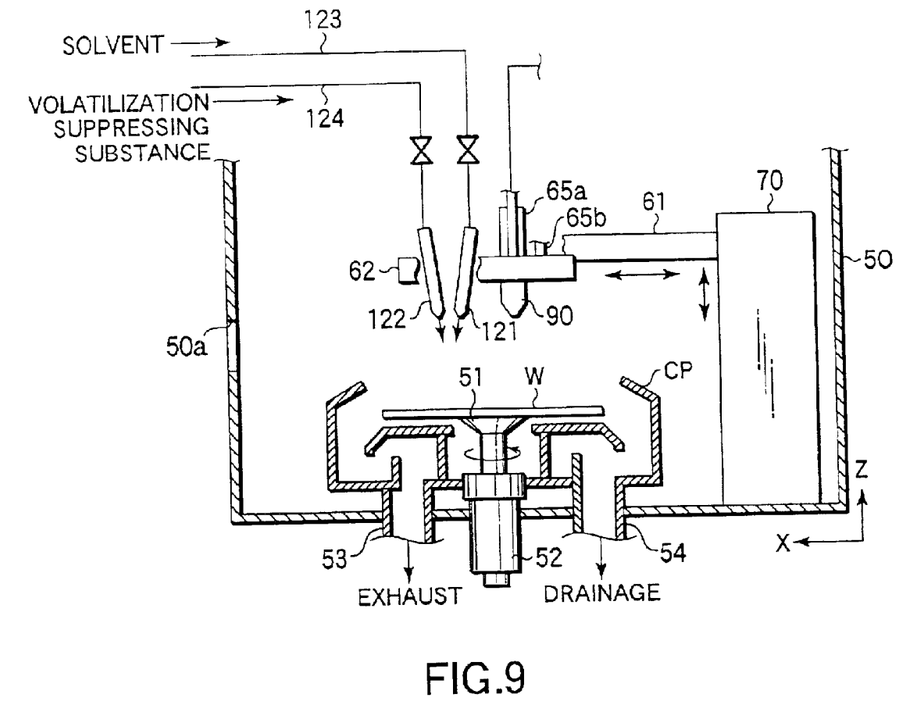
FIG. 9 is a cross sectional view showing still another example of a mixture supply means used in the resist coating unit.

FIG. 9 shows still another example of the mixture supply means. As shown in the drawing, arranged are a solvent supply nozzle 121 and a volatilization suppressing substance supply nozzle 122. In this case, a solvent supply pipe 123 extending from a not shown intermediate tank and a volatilization suppressing substance supply pipe 124 extending from a not shown intermediate tank are connected to the solvent supply nozzle 121 and the volatilization suppressing substance supply nozzle 122, respectively. What should be noted is that the solvent and the volatilization suppressing substance spurted from the solvent supply nozzle 121 and the volatilization suppressing substance supply nozzle 122, respectively, are mixed on the wafer surface so as to form a mixture.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, each of the embodiments described above covers the case where a resist solution is used as a coating liquid. However, the coating liquid is not limited to a resist solution. It is also possible to use another coating liquid such as a coating liquid for forming an antireflection film or an interlayer dielectric film by the rotary coating processing. Also, each of the embodiments described above covers the case where a semiconductor wafer is used as the target substrate. However, the target substrate used in the present invention is not limited to the semiconductor wafer. It is also possible to use another target substrate such as an LCD substrate or a reticle substrate for a mask.

What is claimed is:

1. A method for forming a film, comprising:
    supplying a mixture of water and a solvent for dissolving a coating liquid onto a surface of a target substrate;
    rotating said target substrate thereby expanding said mixture onto an entire surface of the target substrate;
    supplying a coating liquid onto substantially a central portion of said target substrate while rotating the target substrate that has said mixture supplied thereon thereby expanding the coating liquid outward in the a radial direction of target substrate, thereby forming a coating film; and
    centrifugally removing an excess coating liquid after formation of said coating film thereby controlling a thickness of the coating film.

2. The method according to claim 1, further comprising:
    lowering a rotating speed of said target substrate after the supply of said coating liquid is stopped after formation of said coating film thereby making uniform the thickness of said coating film.

3. The method according to claim 2, wherein at least one of propylene glycol monomethyl ether, propylene glycol monomethyl ether acetate, butyl acetate, ethyl lactate, ethyl cellosolve acetate and methyl methoxy propionate is used as said solvent.

4. The method according to claim 3, wherein at least one of propylene glycol monomethyl ether and propylene glycol monomethyl ether acetate is used as said solvent.

5. The method according to claim 1, wherein an amount of said water is not less than 5% by mass and less than 50% by mass of an entire amount of said mixture.

6. The method according to claim 1, wherein said mixture is prepared by mixing said solvent and said water in a container, and the mixture is stored said container.

7. The method according to claim 1, wherein said solvent and said water are separately supplied into a static mixer and mixed in said static mixer thereby preparing said mixture, and the prepared mixture is supplied from said static mixer onto said target substrate through a nozzle.

8. The method according to claim 1, wherein said solvent and said water are mixed within a nozzle thereby preparing said mixture, and the prepared mixture is supplied from said nozzle onto the surface of said target substrate.

9. The method according to claim 1, wherein said solvent and said water are separately supplied onto said target substrate so as to be mixed on the target substrate to prepare said mixture.

10. The method according to claim 1, further comprising:
    adjusting a temperature of said mixture.

11. The method according to claim 10, wherein the temperature is between 18° C. and 24° C.

12. The method according to claim 11, wherein the temperature is adjusted depending on a size of said target substrate.

13. The method according to claim 1, wherein the rotation of said target substrate is stopped when said mixture is supplied onto the target substrate.

14. The method according to claim 1, wherein said mixture is supplied onto said target substrate while rotating the target substrate.

15. The method according to claim 1, further comprising:
    decelerating a rotating speed of said target substrate after the supply of the coating liquid is stopped after formation of said coating film.

16. A method for forming a film, comprising:
    supplying a mixture of a solvent for dissolving a coating liquid and a volatilization suppressing substance for suppressing volatilization of the solvent, onto a surface of a target substrate;
    expanding the mixture onto an entire surface of the target substrate;
    supplying a coating liquid onto substantially a central portion of the target substrate during a rotation of the target substrate having the mixture supplied thereon to thereby expand the coating liquid outward in a radial direction of the target substrate to form a coating film; and
    adjusting a temperature of the mixture based on a size of the target substrate.

17. The method according to claim 16, further comprising:
    centrifugally removing a residual coating liquid after forming said coating film.

18. The method according to claim 16, wherein said volatilization suppressing substance has a hydrogen bond.

19. The method according to claim 18, wherein at least one of water, methyl alcohol, ethyl alcohol and isopropyl alcohol is used as said volatilization suppressing substance.

20. The method according to claim 16, wherein at least one of propylene glycol monomethyl ether, propylene glycol monomethyl ether acetate, butyl acetate, ethyl lactate, ethyl cellosolve acetate and methyl methoxy propionate is used as said solvent.

21. The method according to claim 16, wherein an amount of said volatilization suppressing substance is not less than 5% by mass and less than 50% by mass of an entire amount of said mixture.

* * * * *